United States Patent
Lejeune

(10) Patent No.: US 6,711,519 B2
(45) Date of Patent: Mar. 23, 2004

(54) METHOD FOR THE TESTING OF ELECTRONIC COMPONENTS TAKING THE DRIFT OF THE MEAN INTO ACCOUNT

(75) Inventor: Philippe Lejeune, Sours (FR)

(73) Assignee: Bealach no bo Finne teo/TA Galaxy, Galway (IE)

( * ) Notice: Subject to any disclaimer, the term of this patent is extended or adjusted under 35 U.S.C. 154(b) by 133 days.

(21) Appl. No.: 09/912,716

(22) Filed: Jul. 25, 2001

(65) Prior Publication Data
US 2002/0014896 A1 Feb. 7, 2002

(30) Foreign Application Priority Data
Jul. 28, 2000 (FR) .............................. 00 10016

(51) Int. Cl.$^7$ .............................................. G01R 31/00
(52) U.S. Cl. ...................................... 702/117; 324/765
(58) Field of Search ................ 702/117, 35, 58–59, 702/64, 40, 118, 179, 181, 193, 81–84; 324/512, 519, 522–523, 535, 537, 754; 700/95, 108–109, 121

(56) References Cited

U.S. PATENT DOCUMENTS

| | | | |
|---|---|---|---|
| 4,686,628 A | * 8/1987 | Lee et al. | 702/117 |
| 5,479,340 A | * 12/1995 | Fox et al. | 700/33 |
| 5,719,796 A | * 2/1998 | Chen | 703/13 |
| 5,966,312 A | * 10/1999 | Chen | 703/6 |
| 5,966,527 A | * 10/1999 | Krivokapic et al. | 703/14 |
| 6,184,048 B1 | * 2/2001 | Ramon | 438/14 |
| 6,269,326 B1 | * 7/2001 | Lejeune | 703/2 |
| 6,326,800 B1 | * 12/2001 | Kirihata | 324/760 |
| 6,426,643 B1 | * 7/2002 | Lejeune | 324/765 |
| 6,441,635 B1 | * 8/2002 | Roulet | 324/765 |
| 6,442,499 B1 | * 8/2002 | Gorin | 702/120 |
| 6,484,306 B1 | * 11/2002 | Bokor et al. | 716/21 |

FOREIGN PATENT DOCUMENTS

FR  2749396  12/1997

* cited by examiner

Primary Examiner—Marc S. Hoff
Assistant Examiner—Mary Catherine Baran
(74) Attorney, Agent, or Firm—Patterson, Thuente, Skaar & Christensen, P.A.

(57) ABSTRACT

A method for the testing of electronic components, proposing an optimization of a duration for the tests of this method, includes the step of choosing an earliest possible measurement date (Dm) with respect to an initial testing date (Do). According to this method, this earliest possible measurement date is chosen by considering statistical images (IS) obtained on a population of components (P1, P2) and by comparing these statistical images with one another by means of a criterion. This criterion takes into account a mean and a range of the responses given by the test population during iterations of a same test with different measurement dates.

7 Claims, 2 Drawing Sheets

| Samples | A2 factor | D3 factor | D4 factor |
|---------|-----------|-----------|-----------|
| 2 | 1.880 | 0 | 3.268 |
| 3 | 1.023 | 0 | 2.574 |
| 4 | 0.729 | 0 | 2.282 |
| 5 | 0.577 | 0 | 2.114 |
| 6 | 0.483 | 0 | 2.004 |
| 7 | 0.419 | 0.076 | 1.924 |
| 8 | 0.373 | 0.136 | 1.864 |
| 9 | 0.337 | 0.184 | 1.816 |
| 10 | 0.308 | 0.223 | 1.777 |
| 11 | 0.285 | 0.256 | 1.744 |
| 12 | 0.266 | 0.284 | 1.717 |
| 13 | 0.249 | 0.308 | 1.692 |
| 14 | 0.235 | 0.329 | 1.671 |
| 15 | 0.223 | 0.348 | 1.652 |

METHOD FOR THE TESTING OF ELECTRONIC COMPONENTS TAKING THE DRIFT OF THE MEAN INTO ACCOUNT

BACKGROUND OF THE INVENTION

1. Field of the Invention

An object of the present invention is a method for the testing of electronic components taking into account the drift in the mean of the output response. It can be used especially in the field of the testing of semiconductor electronic components, especially components such as integrated circuits. In the prior art, there is a known method for testing electronic components that reduces the unit testing time for each of the components. The value of the invention is that it proposes a test method that, first of all, reduces the unit testing time and, secondly, can be used to monitor drifts in responses of these tests, these drifts being caused, for example, by an as yet tolerable but possibly disturbing modification of the tested components.

A component to be tested is therefore subjected to a series of unit tests for the testing of each of its functions. A unit test of a function generally comprises the following elementary steps:

at an initial date $D_0$, a terminal of the component, considered to be an input terminal with respect to the test, is subjected to an electrical potential $V_e$, there is a wait, for a specified time period, for the appearance and stabilization of a response at a second terminal of this component, this second terminal being considered to be an output terminal with respect to this test, at a nominal measurement date $Dm_0$ at the end of the time period ($Dm_0-D_0$), this response is measured. In one example, this response is a value $V_s$ of a potential at this output terminal.

Then, to ascertain that the component has given an acceptable or unacceptable response to this unit test, the measured response is compared with fixed acceptance criteria. Namely, in this example, the value of the potential VS is compared with lower and upper acceptance limits. These limits are generally given in manufacturing specifications.

Since the electronic component has a known structure, the time period at the end of which it is possible to observe an expected response with respect to the test is determined theoretically. This theoretical time period ($Dm_{th}-D_0$) is for example computed by the designer of the electronic component. Furthermore, in order to avoid having an excessively high failure rate for this test, a safety margin is taken into account by generally choosing the nominal measurement date $Dm_0$ which is later than the theoretical measurement date $Dm_{th}$ of this test.

Then, the nominal measurement date $Dm_0$ is used as a measurement date for all the components to be tested. This choice, which ensures a response in conformity with the test, has the consequence of considerably increasing the total execution time of a series of tests.

2. Description of the Prior Art

The document WO-A-97/45748 describes a known test method used to reduce the duration of each unit test of a series of tests. To this end, the test method comprises:

a first "learning phase" carried out on a population of acceptable components.

The nominal measurement date $Dm_0$ is used to perform tests on the first components of the batch. Only the components that have given an appropriate response (within the acceptance limits) are incorporated into the population of acceptable components of this batch, this population constituting the learning population. Then, as far as possible, a measurement date $Dm_i$ earlier than the nominal measurement date $Dm_0$ is determined. The tests performed with this measurement date $Dm_i$ must give a still acceptable response with respect to the acceptance limits, a second "application phase" during which all the other components of the batch are tested, by using the earliest measurement date $Dm_i$ determined beforehand.

To determine the earliest measurement date $Dm_i$, the elementary steps of the test defined here above are reiterated on each of the components of the learning population, the measurement date applied being reduced at each iteration, either dichotomously or step by step. To choose the measurement date $Dm_i$ among the intermediate measurement dates tested, $Dm_{i-TEST1}$, $Dm_{i-TEST2}$, the following are compared by means of a criterion:

a statistical image of the responses obtained with at least one tested intermediate measurement date, for example $Dm_{i-TEST1}$, with a statistical image of the responses of this very same learning population, obtained at the nominal measurement date $Dm_0$.

A statistical image comprises all the responses, of the VS type, obtained during the test and especially the computation, on the basis of these values, of the mean M and the standard deviation S, and of all the other statistical values as a function of this mean M and this standard deviation S.

For example, for each statistical image, a statistical value referenced CP is obtained. This value is equal to a ratio between a difference of acceptance limits and the standard deviation S of this statistical image. The difference between the acceptance limits is generally given by a manufacturer's tolerance.

Another statistical value can also be defined to characterize this statistical image. This other value referenced CPK is then equal to the ratio between an absolute value of a difference between the mean and an acceptance limit and the standard deviation S of this statistical image.

To compare the statistical images with one another, their respective statistical values CP or CPK are compared. The earliest possible measurement date $Dm_i$ is chosen from the tested intermediate measurement dates such that its corresponding statistical value $CP_i$ obtained with the measurement date $Dm_i$ remains within a specified proportion of the appreciation criterion $CP_o$, where $CP_o$ is the statistical value characterizing the statistical image obtained with the nominal measurement date $Dm_0$.

In a first example, if a wide range of responses is observed for a tested intermediate date $Dm_{i-TEST1}$ without any predominance of any value, it means that the behavior of the electronic component under this test is not reliably reproducible on this date. According to the method of the invention, the standard deviation $S_{i-TEST1}$ of the statistical image is great and therefore the corresponding value $CP_{i-TEST1}$ will be low, and will certainly no longer be within the set criterion of the specified proportion of $CP_o$. Then, this measurement date $Dm_{i-TEST1}$ will no longer be chosen as the earliest possible measurement date $Dm_i$, and $Dm_i$ will necessarily be greater than this tested date $Dm_{i-TEST}$.

The method of determining the earliest measurement date $Dm_i$ may include another acceptance condition, for example a condition by which this date is necessarily greater than a theoretical minimum measurement date $Dm_{min}$.

The solution proposed in this document WO 97/45748 is problematic because the learning phase preliminary to the execution of the application phase is excessively lengthy. Furthermore, the earliest possible measurement date determined during this learning phase may result in a greater discard rate for the electronic components tested because it may cause these components to be unjustifiably rejected from the good quality production. Indeed, since the learning phase is long, it cannot be carried out too frequently, and then an inappropriate measurement date may be used to test a part of the batch.

From the teaching of the document FR 99 09055, there is a known method also comprising a learning phase and an application phase; and further adding an adjusting phase.

However, this method provides that the learning phase used to define the earliest possible measurement date $Dm_i$ is obtained by comparing:

a statistical image between the responses of the learning population obtained with the nominal measurement $Dm_0$ and a cumulated statistical image, this image corresponding to the image of all the responses obtained on this same population with the tested intermediate measurement date, for example $Dm_{i-TEST1}$, and with the responses obtained on this population on the nominal measurement date $Dm_0$.

To compare the two statistical images with each other, their respective statistical values CPK are compared in the same way. The earliest possible measurement date $Dm_i$ is chosen such that the statistical value $CPK_{total:0+i-TEST1}$ remains within a certain proportion of the criterion of appreciation $Cpk_o$ where $Cpk_o$ is the statistical value characterizing the statistical image obtained with the nominal measurement date $Dm_0$.

Furthermore, this method provides that the application phase will be independent of the learning phase which is performed on a learning population independent of the components of the batch to be tested during the application phase. Thus, the learning phase is achieved independently and only a short adjusting phase is carried out when starting a series of tests to be performed on a batch of components. During this adjusting phase, the earliest measurement date $Dm_i$ is validated and possibly adjusted.

These adjusting phases occur regularly. For example they occur at a certain frequency depending on the given number of the tested parts of the batch. They ensure that the measurement date is always optimized with respect to the duration of the test and optimized with respect to the profitability of this tested output in taking account of the natural variability of the characteristics of production.

During this adjusting phase, a population of good quality components is considered. And just as in the learning phase, the earliest measurement date $Dm_i$ is verified and possibly modified by comparing:

a statistical image of the responses of the population of good quality components obtained with the nominal measurement date $Dm_0$ with a cumulated statistical image, this image corresponding to the image of all the responses obtained on this same population with the measurement date $Dm_i$ as well as the responses obtained on this population at the nominal measurement date $Dm_0$ or with a modified measurement $Dm_{modif}$ as well as the responses obtained on this population at the nominal measurement date $Dm_0$.

As the case may be, it is chosen to apply a modified measurement date $Dm_{modif}$, $Dm_{modif}$ being greater than or equal to the measurement date $Dm_i$ if the comparison between (a) the cumulated statistical image, comprising inter alia the responses obtained on the measurement date $Dm_i$ and (b) the statistical image of this same population obtained with a nominal measurement date $Dm_0$ is not acceptable with respect to a criterion of appreciation.

This approach too raises a problem. Indeed, even if the method comprises an adjusting phase to take account of the intrinsic variability of the production of components, this method tolerates the presence of drift within this production and does not note this drift. According to this test method, the variability of the responses and their drift, if any, are not considered because the statistical images representing these data are compared by means of a statistical value: CPK. Now this statistical value CPK is computed by incorporating lower and upper acceptance limits, and these limits are determined as a function not of the method of manufacture of the components but of tolerable limits with respect to the quality of the manufactured components, namely the specifications of these components.

This method therefore results in the determining of statistical values CPK in the range of a thousand when they are values of response of a statistical image obtained for a measurement date close to the nominal measurement date $Dm_0$. However, since the criterion of appreciation of this statistical value is a comparison with a criterion of acceptance in the range of 3, the mode of determining the earliest possible measurement date $Dm_i$ leads to the choice of a measurement date $Dm_i$ very close to the minimum measurement date $Dm_{min}$. Consequently, the test, with this method, will accept components that have given a response very close to one of the acceptance limits. This however, can be a sign of a drift in the manufacture of these components to be detected.

And even if the adjusting phase corrects the choice of an excessively early measurement date $Dm_i$, the adjusting phase then becomes almost as long as the learning phase, and this too is a drawback. Indeed, this test method makes it necessary to almost routinely increase this measurement date $Dm_i$ during the adjusting phase because the date defined during the learning phase is unsuited to the output to be tested.

SUMMARY OF THE INVENTION

It is an object of the invention to overcome this problem by making a faster detection of the signs of drift in the manufacture of the components. The invention makes it possible especially to limit the search for the earliest measurement date $Dm_i$ to the determining of a measurement date for which the drift of the mean is controlled. Hence, the earliest possible measurement date $Dm_i$ determined according to the method of the invention ensures that reliable responses are obtained to the test. However, the earliest measurement date $Dm_i$ determined according to this method may be later than the one which would have been obtained by using another test method also seeking to reduce the total duration of the testing time.

Indeed, an object of the invention is a method for the testing of electronic components that considers the statistical images of the population of components by representing them by statistical values which, first of all, do not take into account these acceptance limits on the output response. Furthermore, the method according to the invention compares the statistical images with one another, by considering statistical values that have at least one criterion of acceptance that is independent of the acceptance limits. The comparison thus made is far more strict and tolerates less variability of the responses to the test. The earliest measurement date defined according to this method guarantees greater reliability and reduces the need for this date to be corrected far too frequently.

An object of the invention is a method for testing electronic components, wherein a terminal of a component is subjected to an electrical potential at an initial date, a response set up at a terminal of this component is measured on a measurement date, this response is compared with acceptance limits, for the acceptance or rejection of the component as a function of this comparison, the measurement date is defined by means of a criterion applied to compare an intermediate statistical image representing at least responses obtained at a tested intermediate measurement date with a nominal statistical image representing responses obtained at a nominal measurement date, the responses being obtained from a population of good quality components, the measurement date chosen is the earliest possible intermediate measurement date tested, wherein:

the criterion applied to compare the statistical images with one another comprises an assessment of a range of the responses obtained for each of the statistical images.

BRIEF DESCRIPTION OF THE DRAWINGS

The invention will be understood more clearly from the following description and the appended figures. These figures are given purely by way of an indication and in no way restrict the scope of the invention. Of these figures.

DESCRIPTION OF THE PREFERRED EMBODIMENTS

Figure 1:
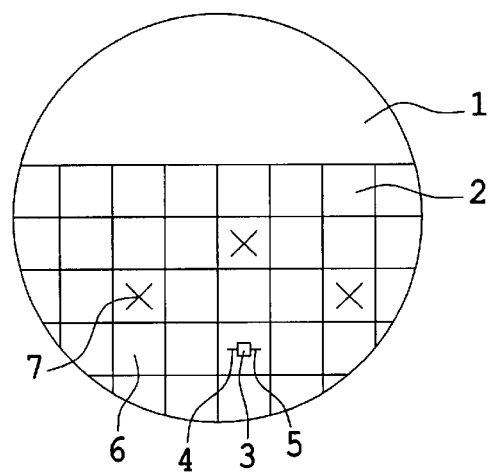
FIG. 1 shows a population of components to be tested according to the method of the invention.

FIG. 1 shows a wafer 1 bearing electronic components 2. This wafer has a circular shape or else a parallelepiped or linear strip shape. The electronic components 2 of this wafer 1 are for example integrated circuit chips. An electronic component has at least one function 3 to be tested.

To test the function 3 of the electronic component 2, a test apparatus is used. This test apparatus has a first set of electrodes that apply the potential $V_e$ to an input terminal 4 and a second set of electrodes that pick up an output potential $V_s$ at the output terminal 5. An interface of the test apparatus manages the transmission of electrical signals and the measurement of picked-up signals. The interface is configured by testing means of the testing apparatus. The configuration of the interface processes the signals sent and received by these testing means.

The terminals 4 and 5 are conductive terminals of the component 2. The output terminal 5 may possibly be the same as the input terminal 4 on this component.

A response to this test generally consists of a measured electrical variable, for example the value of the output potential $V_s$. And the interface, in the light of this response, can be used to decide if a component is good or bad with respect to the test performed. The interface especially provides for the comparison of this response $V_s$ with acceptance limits set by the manufacturer of these components.

To perform the test, the response $V_s$ is measured at a measurement date Dm, this measurement date being necessarily later than an initial date $D_o$ at which the potential $V_e$ has been sent to the input terminals 4.

To improve the time period between Dm and $D_0$, namely generally by reducing it, the operation starts with the determining of the population of good-quality components P1 on the wafer 1. For this purpose, electronic components 2 are tested using a measurement date equal to a nominal measurement date $Dm_0$. This measurement date $Dm_0$ has preferably been determined theoretically while also taking into account an additional safety margin. Generally, this measurement date $Dm_0$ corresponds to the measurement date used by a standard test method that is not optimized. Thus, acceptable components 6 and unacceptable components 7 are identified on the wafer 1. In a preferred example, the population of good-quality components P1 contains only one acceptable component 6. However, it may have several components such as 6.

Then, a statistical image IS of this population P1 is determined. The statistical image IS has a set of N responses obtained from the population P1 by reiterating the same test with the same measurement date. Then, a statistical image IS corresponding to a given measurement date is defined.

Figure 2:
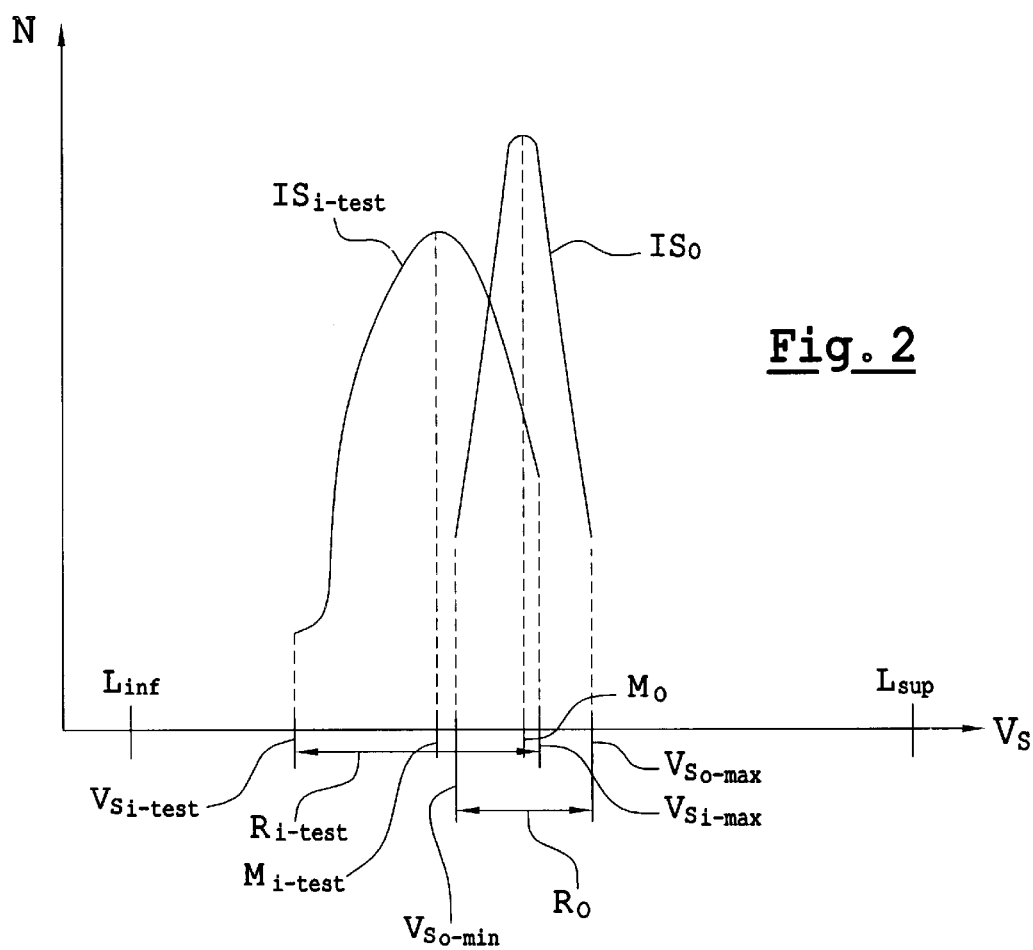
FIG. 2 shows the distribution of the responses of the population of good quality components obtained with a test method according to the invention at different measurement dates.

FIG. 2 shows the nominal statistical image ISO comprising a set of responses $V_{s0}$ of the population P1 obtained following $N_0$ test iterations performed with the nominal measurement date $Dm_0$. A distribution of these responses is generally a Gaussian distribution. The image $IS_0$ can be characterized by the value of a mean $M_0$ and/or a range $R_0$.

The mean $M_0$ corresponds to the mean of all the responses $V_{s0}$ observed for the iterations performed with the same nominal measurement date $Dm_0$.

$$M_0 = \text{sum } (V_{s0})/N_0$$

And the range $R_0$ corresponds to the difference between the greatest response value $V_{s0-max}$ observed and the smallest response value $V_{s0-min}$ observed during these same iterations.

$$R_0 = V_{s0-max} - V_{s0-min}$$

Then, to test earlier measurement dates, the same test is reiterated on the same population P1 with different measurement dates. For example, this test is reiterated a number $N_{i-TEST}$ times with a tested intermediate measurement date $Dm_{i-TEST}$. Then, a statistical image $IS_{i-TEST}$ is obtained, $IS_{i-TEST}$ is then characterized also by a mean $M_{i-TEST}$ and a range $R_{i-TEST}$.

In this case, the mean $M_{i-TEST}$ is defined as being the mean of all the responses $V_{si}$ observed for the iterations made with the same measurement date $Dm_{i-TEST}$.

$$M_{i-TEST} = \text{sum } (V_{si})/N_{i-TEST}$$

And the range $R_{i-TEST}$ corresponds to the difference between the greatest response value $V_{si-max}$ observed and the smallest response value $V_{si-min}$ observed during the same iterations $$R_{i-TEST} = V_{si-max} - V_{si-min}$$

Then, to determine whether the intermediate measurement date tested $Dm_{i-TEST}$ can be accepted as the earliest measurement date to be used during an application phase of the method according to the invention, the statistical images $IS_0$ and $IS_{i\text{-}TEST}$ are compared with one another by means of a criterion.

For example, this measurement date $Dm_{i\text{-}TEST}$ is accepted if the mean $M_{i\text{-}TEST}$ is also included in an acceptance interval. In a preferred example of the invention, if the mean $M_{i\text{-}TEST}$ meets the following condition:

$$|M_{i\text{-}TEST}-M_0|<D-z*S_0*\sqrt{(1/N_{i\text{-}TEST}+1/N_0)}$$

where the mathematical term between vertical slashes corresponds to an absolute value.

$S_0$ is the standard deviation of the responses $V_{s0}$ obtained after $N_0$ iterations and is preferably defined by the following formula:

$$S_0^2=1/(N_0-1)*[\text{sum } (i=1 \text{ to } N_0) \text{ of the } (M_0-V^i{}_{s0})^2].$$

Furthermore, D corresponds to a tolerated deviation between the two means $M_{i\text{-}TEST}$ and $M_0$. D is generally set by an engineer in charge of adjusting the test instrument as a function of the specifications of the tested component.

The parameter z corresponds to a constant that is chosen from the statistical tables as a function of a level of risk chosen with respect to the tests performed. The risk level is defined with respect to a first risk corresponding to what is called a "false alarm" risk and a second risk β corresponding to what is called a "missed signal" risk. The risk α corresponds to a probability of rejecting a component at the end of the test although the component is good. The risk β corresponds to a probability of accepting a component at the end of the test although it is a bad one. The parameter z is chosen so that the risk β is minimal, for example equal to 0,05. In this case, the parameter z is equal to 1.645.

Figures 3, 4:
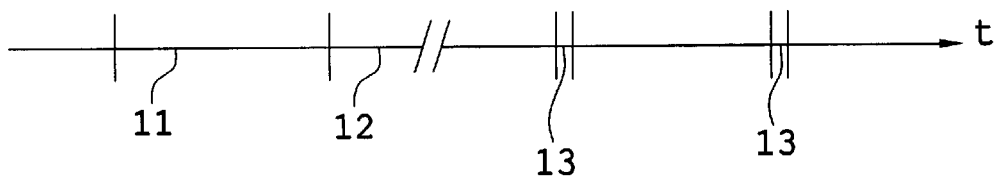
FIG. 3 shows a table of parameters.
FIG. 4 is a timing diagram representing the temporal organization of the learning phase, the adjusting phases and the application phases according to the invention.

In a first variant of the test of the mean, parameters of the table shown in FIG. 3 are used to determine a lower acceptance boundary $BM_{inf}$ and an upper acceptance boundary $BM_{sup}$ of this interval of acceptance of the mean. For example, the parameters A2 proposed in the column 10 are used to compute these boundaries. This interval is defined as a function of the nominal mean $M_0$ and the nominal range $R_0$.

$$BM_{inf}=M_0-A2*R_0,$$

$$BM_{sup}=M_0+A2*R_0,$$

In a second variant of the test of the mean, especially when the nominal amplitude is very low, this interval may be defined differently. In particular, this interval may be determined as a function of the lower limit Linf and the upper limit Lsup determined to assess the responses $V_s$. Then, the lower and upper acceptance boundaries may be defined as follows:

$$BM_{inf}=M_0-A2*f1*(Lsup-Linf),$$

$$BM_{sup}=M_0+A2*f1*(Lsup-Linf),$$

where f1 corresponds to a real value for example between 0 and 1.

In a third variant of the test of the mean, especially when the responses $V_s$ have to fulfill only one condition, with respect to a single limit L, the interval may be defined as follows:

$$BM_{inf}=M_0-A2*f1*|L-M_0|,$$

$$BM_{sup}=M_0+A2*f1*|L-M_0|,$$

The parameters A2 used in the above formulae are chosen as a function of the number of iterations $N_{TEST}$ performed to determine $M_{i\text{-}TEST}$. Indeed the greater the value of $N_{TEST}$, the more reliable will be the mean determined and the more is it likely therefore to be located in a very narrow interval around the nominal mean $M_0$.

Furthermore, it may be decided to accept this measurement date $Dm_{i\text{-}TEST}$ if a second condition is fulfilled with respect to the range $R_{i\text{-}TEST}$. In a preferred example, $Dm_{i\text{-}TEST}$ is chosen if, for one and the same intermediate date tested, accepted with respect to the test on the mean $M_{i\text{-}TEST}$, the corresponding range $R_{i\text{-}TEST}$ meets the following condition:

the absolute value of the difference between $R_{i\text{-}TEST}$ and $R_0$ is lower than a threshold fixed by the engineer in charge of adjusting the instrument as a function of the specifications of the tested component.

In one variant of this test on range, it is possible to use parameters of the table shown in FIG. 3 to determine a lower acceptance boundary $BR_{inf}$ and an upper acceptance boundary $BR_{sup}$ of this acceptance interval of the range. For example, the parameters proposed in the columns 8 and 9 are used to compute these boundaries. This interval is then defined as a function of the nominal range $R_0$.

$BR_{inf}=D3*R_0$ where D3 is a parameter of the column 8.
$BR_{sup}=D4*R_0$ where D4 is a parameter of the column 9.

In a second variant of this test on range, this interval is defined as a function of lower Linf and upper Lsup limits determined, generally by the designer of the test, to assess the responses $V_s$. This variant avoids the need for determining an excessively narrow acceptance interval solely because the nominal range $R_0$ is very small as may be the case when applying the method laid down by the first variable while the actual acceptance interval is far wider. Then, the lower and upper acceptance boundaries may be defined as follows:

$$BR_{inf}=D3*f1*(Lsup-Linf),$$

$$BR_{sup}=D4*f1*(Lsup-Linf),$$

where f1 corresponds to a real value, for example between 0 and 1. In this second variant, the acceptance interval is a function of a percentage of the actual acceptance interval.

In a third variant of the test on range, the interval may be defined as a function of the limits Linf and Lsup and the mean $M_0$ especially when the responses $V_s$ fulfill only one condition with respect only one limit L. Then, the lower and upper acceptance boundaries may be defined as follows:

$$BR_{inf}=D3*f1*|L-M_0|,$$

$$BR_{sup}=D4*f1*|L-M_0|,$$

where the elements defined between two vertical slashes correspond to an absolute value of these elements.

The parameters D3 and D4 used in each of the above formulae are chosen as a function of the number of iterations $N_{TEST}$ performed to determine $R_{i\text{-}TEST}$. Indeed, the greater is $N_{TEST}$, the closer will the upper boundary $BR_{sup}$ of the acceptance interval of the range be to the nominal range $R_0$. At the same time, the greater is $N_{TEST}$, the greater will be the possible distance of the lower boundary $BR_{inf}$ from the nominal range $R_0$. Indeed, it is probable that since the date tested is a measurement date prior to the nominal measurement date, the distribution of the responses $V_s$ thus obtained will be less precise.

If an intermediate measurement date $Dm_{i\text{-}TEST}$ is chosen following this comparison, generally a second earlier intermediate measurement date is tested in the same way. And then, the earliest possible measurement date is chosen for application during the application phase. However, if this intermediate measurement date is not validated following this comparison, another intermediate measurement date is tested. This other intermediate measurement date must be as early as possible and even prior to the nominal measurement date. Generally, intermediate measurement dates are tested according to a step-by-step method in order to choose a measurement date that is the last date to have been validated before the testing of a date that is validated.

According to a special mode of use of this test method, the earliest possible measurement date is determined during a first phase 11 (FIG. 4) known as the learning phase. Then, this determined measurement date is applied continuously during the application phase 12.

In one variant, it is possible to regularly provide for adjusting phases 13 during the application phase 12 to validate the measurement date determined during the learning phase and possibly to determine an adjusted measurement date Dma.

To validate the intermediate measurement date during an adjusting phase, a population P2 of components is considered. These components are correct when they are tested with the nominal measurement date $D_0$. The components of the population P2 preferably come from a batch tested during the application phase. And then, statistical images obtained from iterations of the same test on this population P2 are compared.

Generally, the step of determining an adjusted measurement date Dma is performed only if the earliest intermediate measurement date has not been validated. This adjusted measurement date Dma is then later than the earliest measurement date determined during the learning phase.

To be chosen, an adjusted measurement date Dma must meet the same conditions of comparison as those set forth here above for determining the earliest intermediate measurement date. The consideration of the mean and the range of the results of the population P2 used for the adjusting is assessed in the same way as for the learning phase.

In a first preferred example, during the learning phase, the nominal statistical image $IS_0$ is determined by considering ten values obtained following iterations of the same test using the nominal measurement date $D_0$. Preferably, these ten values are obtained by ten iterations of the same test on the single component constituting the population P1. During this same phase, the earliest possible intermediate measurement date is determined by considering five values obtained by iterations of the test using this immediate measurement date. Preferably, these five values are obtained by five iterations of the test on the single component of the population P1.

In a second preferred example, during the adjusting phases, the nominal statistical image of the population P2 is determined by considering three values obtained using the nominal measurement date $D_0$, these three values being preferably obtained following three iterations of the same test on one and the same component of P2. The earliest measurement date determined during the learning phase is validated, or a measurement date Dma is determined, by considering statistical images obtained for each of these dates from two values. The two values are preferably obtained from two iterations of the same test on the same component of the population P2.

The test method of the invention is applied especially to optimize the testing time of all tests for which a drift of the mean is not tolerable.

In another variant, it can be planned that the optimizing of the testing time will be done in considering a statistical image comprising both the responses $V_s$ and data determined as a function of these responses $V_s$. These data may take account of a tolerated drift of the values $V_s$.

What is claimed is:

1. A method for testing electronic components, comprising the steps of:
   subjecting a first terminal of a component to an electrical potential at an initial date, measuring an output response at a second terminal of this component at a measurement date,
   comparing the measured response with lower and upper acceptance limits for the acceptance or rejection of the component as a function of this comparison to identify good quality components,
   defining the measurement date by means of a criterion applied to compare an intermediate statistical image with a nominal statistical image, wherein the intermediate statistical image represents at least a plurality of responses obtained at a tested intermediate measurement date, and the nominal statistical image represents responses obtained at a nominal measurement date, the responses being obtained from a population of good quality components, further wherein:
   the criterion applied to compare the statistical images with one another comprises an assessment of a range of the responses obtained for each of the statistical images, and an assessment of a mean of the responses obtained for each of the statistical images, and
   the measurement date defined is the earliest possible intermediate measurement date that includes a mean corresponding to the tested measurement date that is within an interval of acceptance with respect to the nominal mean, wherein the interval of acceptance of the mean is determined as a function of a nominal standard deviation of the responses obtained on the nominal measurement date and as a function of a statistical probability.

2. The method according to claim 1, further comprising the step of:
   determining an interval of acceptance of the range corresponding to the tested measurement date as a function of a nominal range and/or as a function of the lower and upper acceptance limits of the output response.

3. The method according to claim 1, wherein
   the interval of acceptance of the mean corresponding to the tested measurement date is determined as a function of the nominal range and/or as a function of the lower and upper acceptance limits of the output response, and
   the intervals of acceptance are determined as a function of parameters coming from a table, these parameters taking into account the number of samples in the statistical images.

4. The method according to claim 1, wherein
   a population of good components comprising a single component is considered.

5. The method according to claim 1, wherein
   the date of measurement is determined during a learning phase before an application phase.

6. The method according to claim 1, wherein
   iterations of the test are carried out on the population of good components with the nominal measurement date, for example to obtain ten values,
   iterations of the test are performed on this same population with an intermediate measurement date, for example to obtain five values.

7. The method according to claim 1, wherein
   the measurement date is modified during an application phase, in the course of an adjusting phase.
   iterations of the test are performed on a population of good quality components coming from the application phase with the nominal measurement date, for example to obtain three values,
   iterations of the test are performed on the same population with an intermediate measurement date, for example to obtain two values.

* * * * *